United States Patent
Kim et al.

(10) Patent No.: US 11,929,546 B2
(45) Date of Patent: Mar. 12, 2024

(54) ELECTRONIC DEVICE COMPRISING ARRAY ANTENNA

(71) Applicant: Samsung Electronics Co., Ltd., Gyeonggi-do (KR)

(72) Inventors: Jaehyung Kim, Gyeonggi-do (KR); Jinkyu Bang, Gyeonggi-do (KR); Jaebong Chun, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 599 days.

(21) Appl. No.: 17/259,445

(22) PCT Filed: Jul. 11, 2019

(86) PCT No.: PCT/KR2019/008557
§ 371 (c)(1),
(2) Date: Jan. 11, 2021

(87) PCT Pub. No.: WO2020/013625
PCT Pub. Date: Jan. 16, 2020

(65) Prior Publication Data
US 2021/0280961 A1    Sep. 9, 2021

(30) Foreign Application Priority Data

Jul. 11, 2018 (KR) .................. 10-2018-0080509

(51) Int. Cl.
*H05K 1/14* (2006.01)
*H01Q 1/24* (2006.01)
(Continued)

(52) U.S. Cl.
CPC .......... *H01Q 1/243* (2013.01); *H01Q 9/0407* (2013.01); *H01Q 9/16* (2013.01); *H05K 1/142* (2013.01);
(Continued)

(58) Field of Classification Search
CPC ........ H01Q 1/243; H01Q 9/0407; H01Q 9/16; H05K 1/142; H05K 5/0017; H05K 5/0226;
(Continued)

(56) References Cited

U.S. PATENT DOCUMENTS 5,990,839 A     11/1999  Schefte et al.
8,917,218 B2 *  12/2014  Kato ........................ H01Q 7/00
                                                            343/788

(Continued)

FOREIGN PATENT DOCUMENTS

CN    105896071     8/2016
KR    20010006237   1/2001
(Continued)

OTHER PUBLICATIONS

KR Notice of Patent Grant dated Dec. 22, 2022 issued in counterpart application No. 10-2018-0080509, 4 pages.
(Continued)

*Primary Examiner* — Jacob R Crum
(74) *Attorney, Agent, or Firm* — The Farrell Law Firm, P.C.

(57) ABSTRACT

An electronic device comprising an array antenna according to various embodiments of the present invention may comprise: a housing comprising a first plate, a second plate facing away from the first plate, and a side member surrounding the space between the first plate and the second plate; a display visible through a part of the first plate; a first printed circuit board comprising a first surface facing the side member, a second surface facing away from the first surface, a first edge adjacent close to the first plate, and a second edge closer to the second plate than the first edge, the first printed circuit board comprising one or more conductive plates on the first surface; a second printed circuit board
(Continued)

extending from the first edge so as to bend at an obtuse angle with regard to the first surface, the second printed circuit board comprising one or more first conductive patterns; a third printed circuit board extending from the second edge so as to bend at an obtuse angle with regard to the first surface, the third printed circuit board comprising one or more second conductive patterns; and a wireless communication circuit electrically connected to the conductive plates, the first conductive patterns, and the second conductive patterns and configured to transmit and/or receive signals. Various other embodiments may be possible.

13 Claims, 15 Drawing Sheets

(51) Int. Cl.
| | | |
|---|---|---|
| | *H01Q 9/04* | (2006.01) |
| | *H01Q 9/16* | (2006.01) |
| | *H05K 5/00* | (2006.01) |
| | *H05K 5/02* | (2006.01) |
| | *H04B 1/40* | (2015.01) |

(52) U.S. Cl.
CPC ......... *H05K 5/0017* (2013.01); *H05K 5/0226* (2013.01); *H04B 1/40* (2013.01); *H05K 2201/09018* (2013.01); *H05K 2201/10098* (2013.01); *H05K 2201/10128* (2013.01)

(58) Field of Classification Search
CPC .......... H05K 2201/09018; H05K 2201/10098; H05K 2201/10128; H04B 1/40
See application file for complete search history.

(56) References Cited

U.S. PATENT DOCUMENTS

| | | | |
|---|---|---|---|
| 9,917,347 B2* | 3/2018 | Bologna | ............... G06F 1/1698 |
| 2003/0151548 A1 | 8/2003 | Kingsley et al. | |
| 2004/0174303 A1 | 9/2004 | Duxbury et al. | |
| 2007/0115185 A1 | 5/2007 | Ying et al. | |
| 2008/0001830 A1* | 1/2008 | Hirai | ................... H04M 1/0214 |
| | | | 343/702 |
| 2012/0223866 A1 | 9/2012 | Ayala Vazquez et al. | |
| 2014/0028525 A1 | 1/2014 | Ying | |
| 2015/0070219 A1 | 3/2015 | Dinh et al. | |
| 2018/0026341 A1* | 1/2018 | Mow | ..................... H01Q 1/243 |
| | | | 343/702 |
| 2018/0123242 A1 | 5/2018 | Jeon et al. | |
| 2019/0229404 A1* | 7/2019 | Xia | ........................ H01Q 21/22 |

FOREIGN PATENT DOCUMENTS

| | | |
|---|---|---|
| KR | 20140070783 | 4/2014 |
| KR | 20180046694 | 5/2018 |
| WO | WO2017212287 | 12/2017 |

OTHER PUBLICATIONS

PCT/ISA/210 Search Report issued on PCT/KR2019/008557, dated Oct. 18, 2019, pp. 5.
PCT/ISA/237 Written Opinion issued on PCT/KR2019/008557, dated Oct. 18, 2019, pp. 4.
Korean Office Action dated Jun. 6, 2022 issued in counterpart application No. 10-2018-0080509, 16 pages.

* cited by examiner

ELECTRONIC DEVICE COMPRISING ARRAY ANTENNA

PRIORITY

This application is a National Phase Entry of International Application No. PCT/KR2019/008557, which was filed on Jul. 11, 2019, and claims priority to Korean Patent Application No. 10-2018-0080509, filed in the Korean Intellectual Property Office on Jul. 11, 2018, the entire content of each of which is incorporated herein by reference.

TECHNICAL FIELD

Various embodiments relate to an electronic device including an array antenna.

BACKGROUND ART

With the development of wireless communication technology, electronic devices (e.g., electronic devices for communication) are commonly used in everyday life, and due to the rapid increase in mobile traffic due to the use of contents, the $5^{th}$ generation (5G) mobile communication technology based on ultra-high band frequencies equal to or higher than 20 GHz is being developed. Ultra-high band frequency signals include millimeter waves (mmWaves) having a frequency band of 20 GHz to 100 GHz. When using an ultra-high band frequency, an antenna and an electronic device can be reduced in terms of size and/or weight since the wavelength is short. In addition, since it is possible to mount relatively many antennas in the same area due to the short wavelength, signals can be transmitted to be concentrated in a specific direction. In addition, since it is possible to use a wide bandwidth, a larger amount of information can be transmitted.

DISCLOSURE OF INVENTION

Technical Problem

Next-generation wireless communication technology may use millimeter waves of 20 GHz or more in practice. In order to overcome high free-space loss due to frequency characteristics and to increase an antenna gain, a communication device including an array antenna in which a plurality of antennas are arranged at regular intervals may be mounted inside an electronic device. Since electronic devices are gradually becoming slimmer and are equipped with a communication device, at least a partial area of an array antenna may overlap or may be disposed close to a metal of a housing. Due to this, the radiation performance of the communication device may be deteriorated.

In an electronic device according to various embodiments, since beams generated in a communication device are generated such that the directions thereof deviate from a metal portion included in a housing, it is possible to prevent deterioration of radiation performance in the communication device.

Solution to Problem

An electronic device according to various embodiments may include: a housing including a first plate, a second plate facing away from the first plate, and a side member surrounding the space between the first plate and the second plate; a display visible through a portion of the first plate; a first printed circuit board including a first surface facing the side member, a second surface facing away from the first surface, a first edge located close to the first plate, and a second edge located closer to the second plate than the first edge, the first printed circuit board including one or more conductive plates on the first surface; a second printed circuit board extending from the first edge and bent while forming an obtuse angle with the first surface, the second printed circuit board including one or more first conductive patterns; a third printed circuit board extending from the second edge and bent while forming an obtuse angle with the first surface, the third printed circuit board including one or more second conductive patterns; and a wireless communication circuit electrically connected to the conductive plates, the first conductive patterns, and the second conductive patterns, and configured to transmit and/or receive a signal.

An electronic device according to various embodiments may include: a first housing; a second housing; a hinge connecting the first housing and the second housing to be rotatable about an axis between the first housing and the second housing; a first printed circuit board including, inside the hinge, a first surface between the first housing and the second housing, a second surface facing away from the first surface, a first edge located close to the first housing, and a second edge located closer to the second housing than the first edge, the first printed circuit board including one or more conductive plates on the first surface; a second printed circuit board extending from the first edge and bent while forming an obtuse angle with the first surface, the second printed circuit board including one or more first conductive patterns; a third printed circuit board extending from the second edge and bent while forming an obtuse angle with the first surface, the third printed circuit board including one or more second conductive patterns; and a wireless communication circuit electrically connected to the conductive plates, the first conductive patterns, and the second conductive patterns, and configured to transmit and/or receive a signal having a frequency.

An electronic device according to various embodiments may include: a housing including a first plate, a second plate facing away from the first plate, and a side member surrounding the space between the first plate and the second plate; a display visible through a portion of the first plate; a first printed circuit board including a first surface facing the side member, a second surface facing away from the first surface, a first edge located close to the first plate, and a second edge located closer to the second plate than the first edge; a second printed circuit board extending from the first edge and bent while forming an obtuse angle with the first surface, the second printed circuit board including one or more first conductive patterns; a third printed circuit board extending from the second edge and bent while forming an obtuse angle with the first surface, the third printed circuit board including one or more second conductive patterns; and a wireless communication circuit electrically connected to the first conductive patterns and the second conductive patterns, and configured to transmit and/or receive a signal.

Advantageous Effects of Invention

In an electronic device according to various embodiments, the directions of beams generated to transmit and receive signals in the communication device may be diversified. Through this, even if a communication device is mounted in the electronic device, beams generated in the communication device can be generated such that the directions thereof deviate from a metal of a housing. Accordingly, it is possible to prevent deterioration in radiation performance in the communication device.

BEST MODE FOR CARRYING OUT THE INVENTION

Hereinafter, various embodiments disclosed herein will be described with reference to the accompanying drawings.

Figure 1:
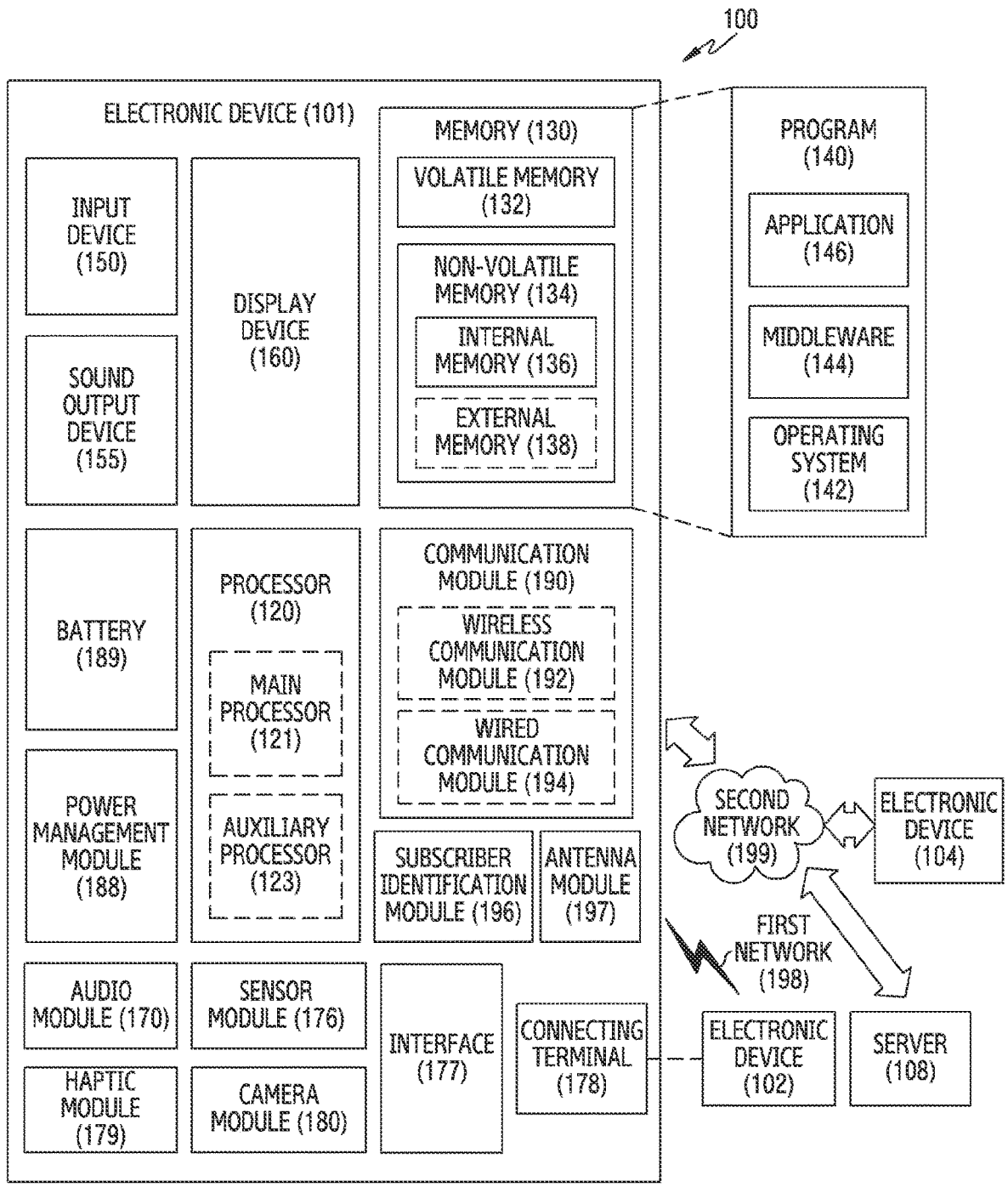
FIG. 1 is a block diagram of an electronic device according to various embodiments in a network environment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
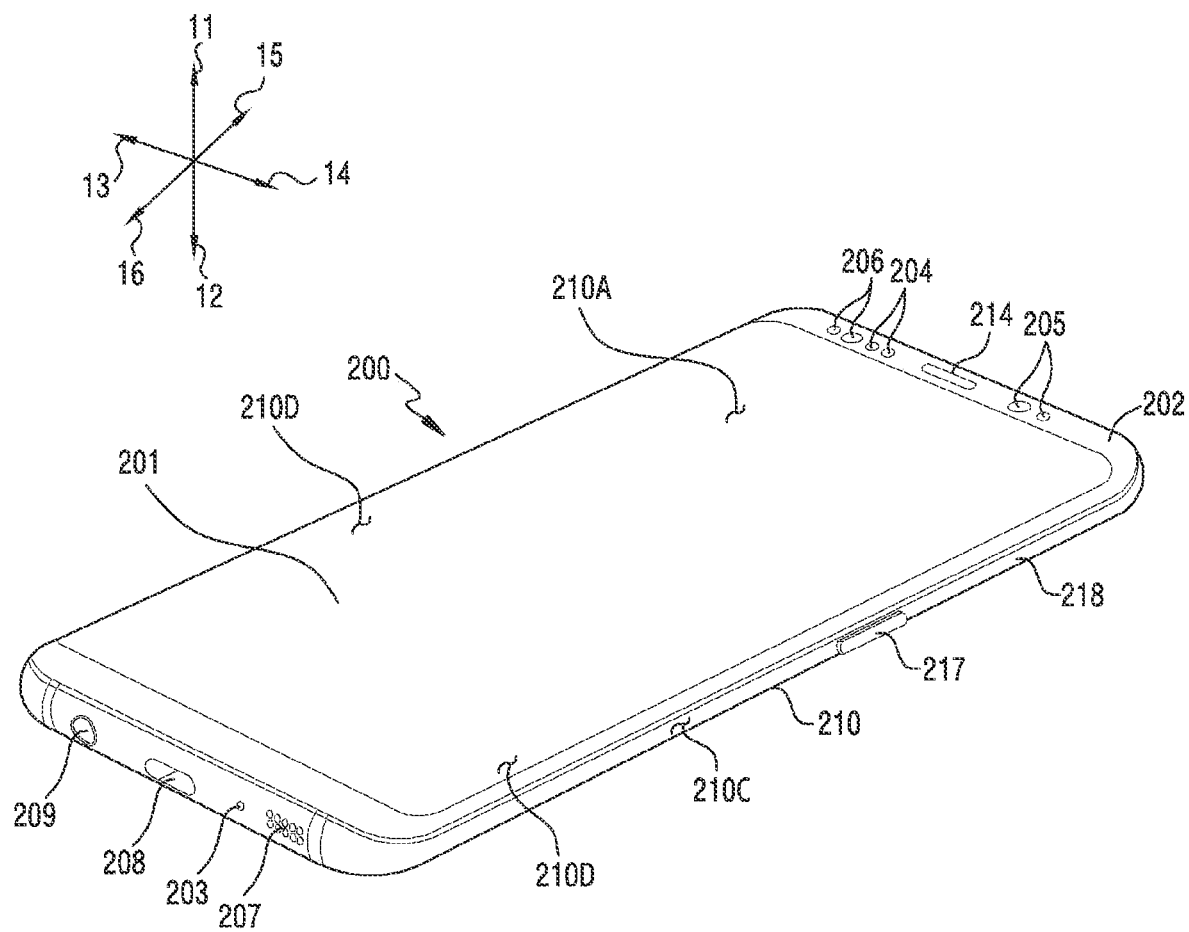
FIG. 2A is a perspective view illustrating an electronic device according to various embodiments.
Figure 2B:
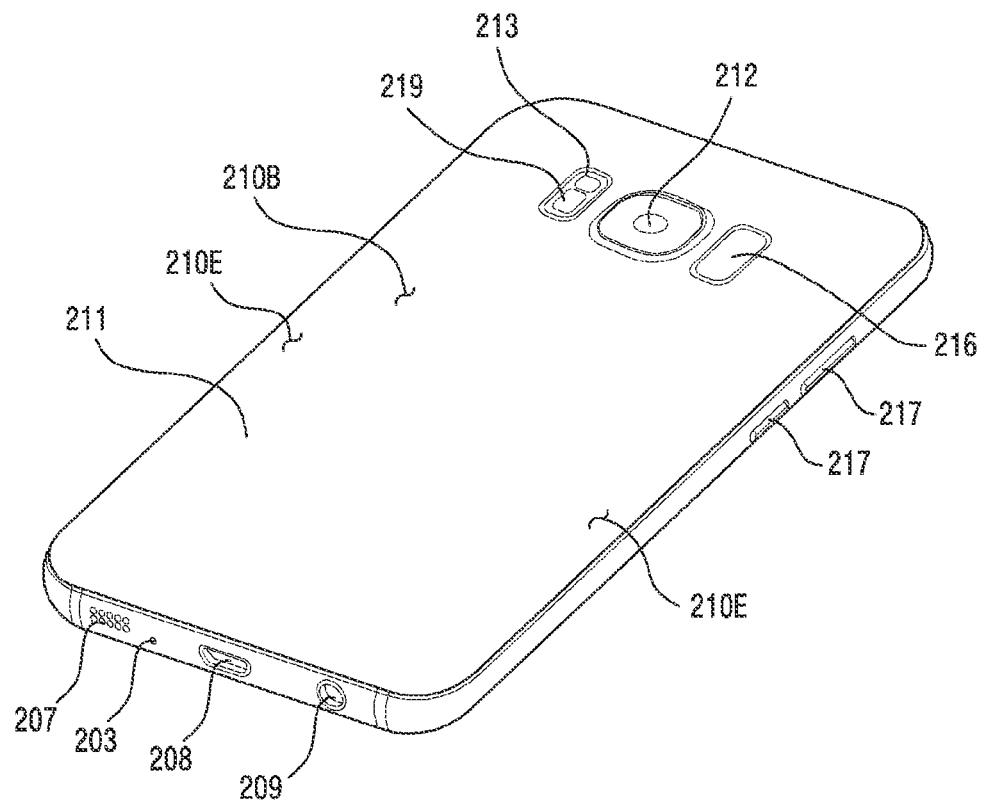
FIG. 2B is a rear perspective view illustrating an electronic device according to various embodiments.

FIG. 2A is a front perspective view illustrating an electronic device 200 (e.g., the electronic device 101 in FIG. 1) according to various embodiments. FIG. 2B is a rear perspective view illustrating the electronic device 200 according to various embodiments.

Referring to FIGS. 2A and 2B, the electronic device 200 according to various embodiments may include a housing 210, wherein the housing 210 includes a first surface (or a front surface) 210A, a second surface (or a rear surface) 210B, and a side surface 210C surrounding the space between the first surface 210A and the second surface 210B. In an embodiment (not illustrated), the term "housing" may refer to a structure forming some of the first surface 210A, the second surface 210B, and the side surface 210C of FIG. 2. According to an embodiment, at least a portion of the first surface 210A may be formed by a substantially transparent front plate 202 (e.g., a glass plate or a polymer plate including various coating layers). The second surface 210B may be formed by a substantially opaque rear plate 211. The rear plate 211 may be made of, for example, coated or colored glass, ceramic, a polymer, a metal (e.g., aluminum, stainless steel (STS), or magnesium), or a combination of two or more of these materials. The side surface 210C may be formed by a side bezel structure (or a "side member") 218 coupled to the front plate 202 and the rear plate 211 and including a metal and/or a polymer. In some embodiments, the rear plate 211 and the side bezel structure 218 may be integrally formed, and may include the same material (e.g., a metal material such as aluminum).

In the illustrated embodiment, the front plate 202 may include two first areas 210D, which are bent from the first surface 210A toward the rear plate 211 and extend seamlessly, at the long opposite side edges thereof. In the illustrated embodiment (see FIG. 2B), the rear plate 211 may include, at the long opposite side edges thereof, two second areas 210E, which are bent from the second surface 210B toward the front plate 202 and extend seamlessly. In some embodiments, the front plate 202 (or the rear plate 211) may include only one of the first areas 210D (or the second areas 210E). In an embodiment, some of the first areas 210D and the second areas 210E may not be included. In the above embodiments, when viewed from a side of the electronic device 200, the side bezel structure 218 may have a first thickness (or width) on the side surface side at which the first areas 210D or the second areas 210E are not included, and may have a second thickness (or width), which is smaller than the first thickness, on the side surface side at which the first areas 210D or the second areas 210E are included.

According to an embodiment, the electronic device 200 may include at least one of a display 201, audio modules 203, 207, and 214, sensor modules 204, 216, and 219, camera modules 205, 212, and 213, key input devices 217, light-emitting elements 206, and connector holes 208 and 209. In some embodiments, at least one of the components (e.g., the key input devices 217 or the light-emitting elements 206) may be omitted from the electronic device 200, or other components may be additionally included in the electronic device 101.

The display 201 may be exposed through, for example, a considerable portion of the front plate 202. In some embodiments, at least a portion of the display 201 may be exposed through the front plate 202 forming the first surface 210A and the first areas 210D of the side surface 210C. In some embodiments, the edges of the display 201 may be formed to be substantially the same as the shape of the periphery of the front plate 202 adjacent thereto. In an embodiment (not illustrated), the distance between the outer periphery of the display 201 and the outer periphery of the front plate 202 may be substantially constant in order to enlarge the exposed area of the display 201.

In an embodiment (not illustrated), recesses or openings may be formed in some portions of the screen display area of the display 201, and one or more of the audio module 214, the sensor module 204, the camera module 205, and the light-emitting elements 206 may be aligned with the recesses or the openings. In an embodiment (not illustrated), the rear surface of the screen display area of the display 201 may include at least one of the audio modules 214, the sensor modules 204, the camera modules 205, the fingerprint sensor 216, and the light-emitting elements 206. In an embodiment (not illustrated), the display 201 may be coupled to or disposed adjacent to a touch-sensitive circuit, a pressure sensor capable of measuring a touch intensity (pressure), and/or a digitizer configured to detect a magnetic-field-type stylus pen. In some embodiments, at least some of the sensor modules 204 and 219 and/or at least some of the key input devices 217 may be disposed in the first areas 210D and/or the second areas 210E.

The audio modules 203, 207, and 214 may include a microphone hole 203 and speaker holes 207 and 214. The microphone hole 203 may include a microphone disposed therein so as to acquire external sound, and in some embodiments, multiple microphones may be disposed therein so as to enable detection of the direction of sound. The speaker holes 207 and 214 may include an external speaker hole 207 and a phone call receiver hole 214. In some embodiments, the speaker holes 207 and 214 and the microphone hole 203 may be implemented as a single hole, or a speaker may be included without the speaker holes 207 and 214 (e.g., a piezo speaker).

The sensor modules 204, 216, and 219 may generate electrical signals or data values corresponding to the internal operating state or the external environmental state of the electronic device 200. The sensor modules 204, 216, and 219 may include, for example, a first sensor module 204 (e.g., a proximity sensor), a second sensor module (not illustrated) (e.g., a fingerprint sensor) disposed on the first surface 210A of the housing 210, a third sensor module 219 (e.g., an HRM sensor), and/or a fourth sensor module 216 (e.g., a fingerprint sensor) disposed on the second surface 210B of the housing 210. The fingerprint sensor may be disposed not only on the first surface 210A (e.g., the display 201) of the housing 210, but also on the second surface 210B. The electronic device 200 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 204.

The camera modules 205, 212, and 213 may include a first camera device 205 disposed on the first surface 210A of the electronic device 200, a second camera device 212 disposed on the second surface 210B thereof, and/or a flash 213. The camera modules 205 and 212 may include one or more lenses, an image sensor, and/or an image signal processor. The flash 213 may include, for example, a light-emitting diode or a xenon lamp. In some embodiments, two or more lenses (e.g., an infrared camera lens, a wide-angle lens, and a telephoto lens) and image sensors may be disposed on one surface of the electronic device 200.

The key input devices 217 may be disposed on the side surface 210C of the housing 210. In an embodiment, the electronic device 200 may not include some or all of the above-mentioned key input devices 217, and a key input device 217 not included in the electronic device 200 may be implemented in another form, such as a soft key, on the display 201. In some embodiments, the key input devices may include a sensor module 216 disposed on the second surface 210B of the housing 210.

The light-emitting elements 206 may be disposed, for example, on the first surface 210A of the housing 210. The light-emitting elements 206 may provide, for example, information about the state of the electronic device 200 in an optical form. In an embodiment, the light-emitting element 206 may provide a light source that is interlocked with the operation, for example, of the camera module 205. The light-emitting elements 206 may include, for example, an LED, an IR LED, and a xenon lamp.

The connector holes 208 and 209 may include a first connector hole 208, which is capable of accommodating a connector (e.g., a USB connector) for transmitting/receiving power and/or data to/from an external electronic device, and/or a second connector hole 209, which is capable of accommodating a connector (e.g., an earphone jack) for transmitting/receiving an audio signal to/from an external electronic device.

Figure 2C:
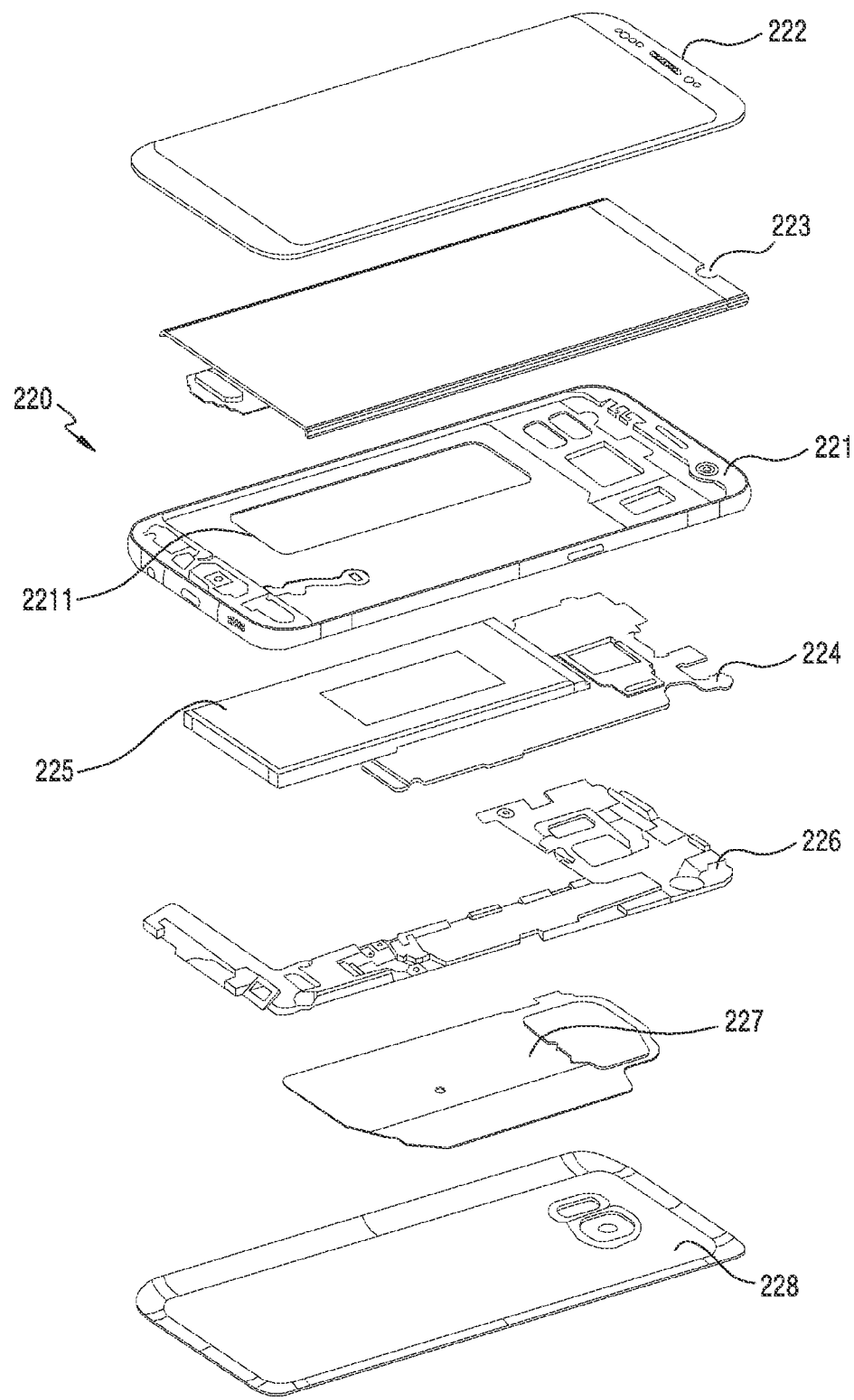
FIG. 2C is an exploded perspective view illustrating an electronic device according to various embodiments.

FIG. 2C is an exploded perspective view illustrating an electronic device 220 (e.g., the electronic device 200 in FIG. 2A) according to various embodiments.

Referring to FIG. 2C, an electronic device 220 may include a side bezel structure 221, a first support member 2211 (e.g., a bracket), a front plate 222, a display 223, a printed circuit board 224, a battery 225, a second support member 226 (e.g., a rear case), an antenna 227, and a rear plate 228. In some embodiments, at least one of the components (e.g., the first support member 2211 or the second support member 226) may be omitted from the electronic device 220, or other components may be additionally included in the electronic device 101. At least one of the components of the electronic device 220 may be the same as or similar to at least one of the components of the electronic device 200 of FIG. 2A or 2B, and a redundant description thereof is omitted below.

The first support member 2211 may be disposed inside the electronic device 220 so as to be connected to the side bezel structure 221, or may be formed integrally with the side bezel structure 221. The first support member 2211 may be formed of, for example, a metal material and/or a non-metal material (e.g., a polymer). The display 223 may be coupled to one surface of the first support member 2211, and the printed circuit board 224 may be coupled to the other surface of the first support member 311. On the printed circuit board 224, a processor, a memory, and/or an interface may be mounted. The processor may include at least one of, for example, a central processing unit, an application processor, a graphics processor, an image signal processor, a sensor hub processor, or a communication processor.

The memory may include, for example, a volatile memory or a nonvolatile memory.

The interface may include, for example, a high-definition multimedia interface (HDMI), a universal serial bus (USB) interface, an SD card interface, and/or an audio interface. The interface may electrically or physically connect, for example, the electronic device 220 to an external electronic device, and may include a USB connector, an SD card/MMC connector, or an audio connector.

The battery 225 is a device for supplying power to at least one component of the electronic device 220, and may include, for example, a non-rechargeable primary battery, a rechargeable secondary battery, or a fuel cell. At least a portion of the battery 225 may be disposed on substantially the same plane as, for example, the printed circuit board 224. The battery 225 may be integrally disposed inside the electronic device 220, or may be detachably disposed on the electronic device 220.

The antenna 227 may be disposed between the rear plate 228 and the battery 225. The antenna 227 may include, for example, a nearfield communication (NFC) antenna, a wireless charging antenna, and/or a magnetic secure transmission (MST) antenna. The antenna 227 may perform short-range communication with, for example, an external electronic device, or may transmit/receive power required for charging to/from the external device in a wireless manner. In an embodiment, an antenna structure may be formed by a portion of the side bezel structure 221, a portion of the first support member 2211, or a combination thereof.

Figure 3A:
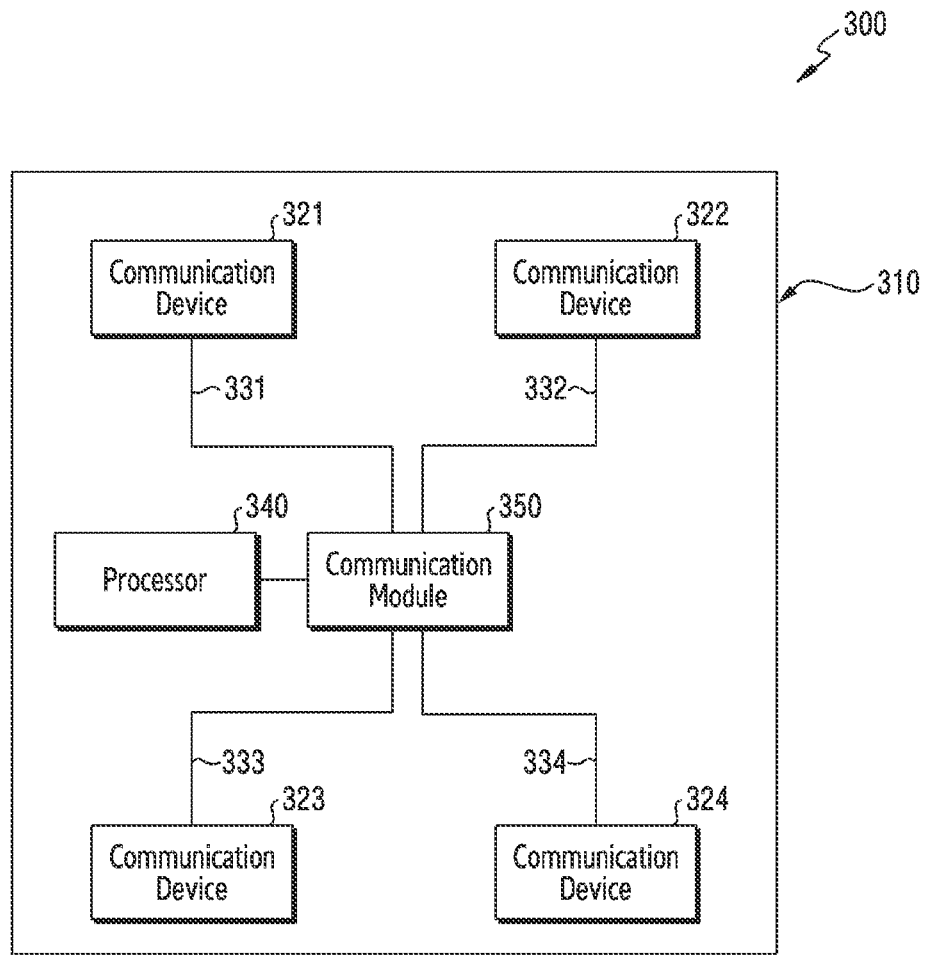
FIG. 3A is a view illustrating an electronic device according to an embodiment that supports 5G communication.

FIG. 3A is a view illustrating an electronic device 300 according to an embodiment, which supports 5G communication.

Referring to FIG. 3A, the electronic device 300 (e.g., the electronic device 200 in FIG. 2A) according to an embodiment may include a housing 310, a processor 340, a communication module 350 (e.g., the communication module 190 in FIG. 1), a first communication device 321, a second communication device 322, a third communication device 323, a fourth communication device 324, a first conductive line 331, a second conductive line 332, a third conductive line 333, and/or a fourth conductive line 334.

According to an embodiment, the housing 310 is capable of protecting the other components of the electronic device 300. The housing 310 may include, for example, a front plate, a rear plate facing away from the front plate, and a side member (or a metal frame) attached to or integrally formed with the rear plate and surrounding the space between the front plate and the rear plate.

According to an embodiment, the electronic device 300 may include a first communication device 321, a second communication device 322, a third communication device 323, and/or a fourth communication device 324.

According to an embodiment, the first communication device 321, the second communication device 322, the third communication device 323, and/or the fourth communication device 324 may be located inside the housing 310. According to an embodiment, when viewed from above the rear plate of the electronic device 300, the first communication device 321 may be located at the upper-left end of the electronic device 300, the second communication device 322 may be located at the upper-right end of the electronic device 300, the third communication device 323 may be disposed at the lower-left end of the electronic device 300, and the fourth communication device 324 may be disposed at the lower-right end of the electronic device 300.

According to an embodiment, the processor 340 may include one or more of a central processing unit, an application processor, a graphics processing unit (GPU), a camera image signal processor, or a baseband processor (or a communication processor (CP)). According to an embodiment, the processor 340 may be implemented as a system-on-chip (SoC) or a system-in package (SiP).

According to an embodiment, the communication module 350 may be electrically connected to the first communication device 321, the second communication device 322, the third communication device 323, and/or the fourth communication device 324 using the first conductive line 331, the second conductive line 332, the third conductive line 333, and/or the fourth conductive line 334. The communication module 350 may include, for example, a baseband processor, or at least one communication circuit (e.g., an IFIC or an RFIC). The communication module 350 may include, for example, a baseband processor separate from the processor 340 (e.g., an application processor (AP)). The first conductive line 331, the second conductive line 332, the third conductive line 333, and/or the fourth conductive line 334 may include, for example, a coaxial cable or an FPCB.

According to an embodiment, the communication module 350 may include a first baseband processor (BP) (not illustrated) and/or a second BR (not illustrated). The electronic device 300 may further include one or more interfaces for supporting chip-to-chip communication between the first BP (or the second BP) and the processor 340. The processor 340 and the first BP and/or the second BP may transmit and receive data using an inter-chip interface (an inter-process communication channel).

According to an embodiment, the first BP and/or the second BP may provide an interface for performing communication with other entities. The first BR may support, for example, wireless communication for a first network (not illustrated). The second BP may support, for example, wireless communication for a second network (not illustrated).

According to an embodiment, the first BP and/or the second BP may configure a single module with the processor 340. For example, the first BP or the second BP may be integrally formed with the processor 340. As another example, the first BP and/or the second BP may be disposed in a single chip, or may be fabricated in the form of an independent chip. According to an embodiment, the processor 340 and at least one BP (e.g., the first BP) may be integrally disposed in a single chip (an SoC chip), and the other BP (e.g., the second BP) may be fabricated in the form of an independent chip.

According to an embodiment, the first network (not illustrated) and/or the second network (not illustrated) may correspond to the network 199 of FIG. 1. According to an embodiment, the first network (not illustrated) and/or the second network (not illustrated) may include a $4^{th}$ generation (4G) network and a $5^{th}$ generation (5G) network. The 4G network may support, for example, a long-term evolution (LTE) protocol defined in the 3GPP. The 5G network may support, for example, a new radio (NR) protocol defined in the 3GPP.

Figure 3B:
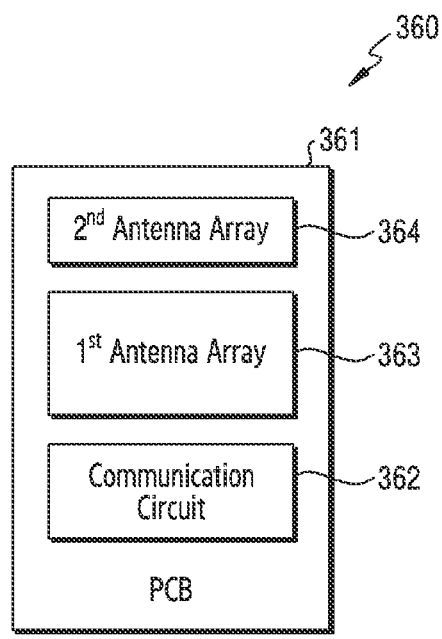
FIG. 3B is a block diagram of a communication device according to an embodiment.

FIG. 3B is a block diagram of a communication device 360 according to an embodiment.

Referring to FIG. 3B, according to an embodiment, the communication device 360 (e.g., the first communication device 321, the second communication device 322, the third communication device 323, or the fourth communication device 324 in FIG. 3A) may include a communication circuit 362 (e.g., an RFIC), a printed circuit board (PCB) 361, a first antenna array 363, and/or a second antenna array 364.

According to an embodiment, the communication circuit 362, the first antenna array 363, or the second antenna array 364 may be disposed on the PCB 361. For example, the first antenna array 363 and/or the second antenna array 364 may be disposed on a first surface of the PCB 361 and the communication circuit 362 may be disposed on a second surface of the PCB 361. The PCB 361 may include a connector (e.g., a coaxial cable connector or a board-to-board (B-to-B) connector) to be electrically connected to another PCB (e.g., a PCB on which the communication module 350 of FIG. 3A is disposed) using a transmission line (e.g., the first conductive line 331 in FIG. 3A or a coaxial cable). The PCB 361 is coaxially connected to a PCB on which the communication module 350 is disposed using, for example, a coaxial cable connector, and the coaxial cable may be used for delivering transmission and/or reception IF signals or RF signals. As another example, power or other control signals may be transferred through the B-to-B connector.

According to an embodiment, the first antenna array 363 and/or the second antenna array 364 may include multiple antenna elements. The antenna elements may include a patch antenna, a loop antenna, and/or a dipole antenna. For example, the antenna elements included in the first antenna array 363 may be patch antennas in order to generate beams toward the rear plate of the electronic device 360. As another example, the antenna elements included in the second antenna array 364 may be a dipole antenna and/or a loop antenna in order to generate beams toward the side member of the electronic device (e.g., the electronic device 200 in FIG. 2A).

As an embodiment, the communication circuit 362 may support at least part of a band from 3 GHz to 100 GHz (e.g., from 24 GHz to 30 GHz or from 37 GHz to 40 GHz). According to an embodiment, the communication circuit 362 may upconvert and/or downconvert the frequency. For example, the communication circuit 362 included in the communication device 360 (e.g., the first communication device 321 in FIG. 3A) may upconvert an IF signal received from a communication module (e.g., the communication module 350 in FIG. 3A) via a conductive line (e.g., the first conductive line 331 in FIG. 3A) into an RF signal. As another example, the communication circuit 362 included in the communication device 360 (e.g., the first communication device 321 in FIG. 3A) may downconvert an RF signal (e.g., a mmWave signal) received via the first antenna array 363 or the second antenna array 364 into an IF signal, and may transmit the IF signal to the communication module using a conductive line.

Figure 4A:
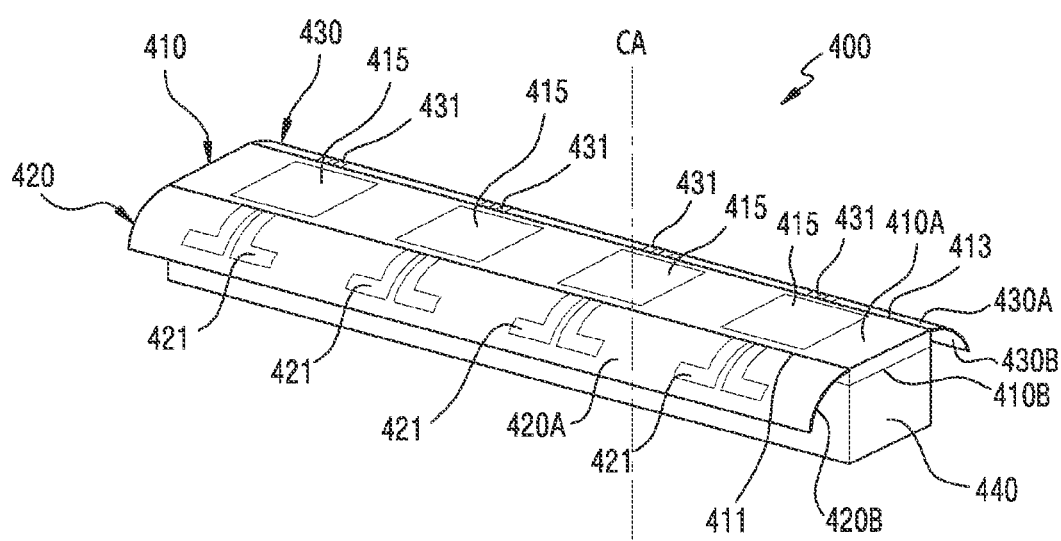
FIG. 4A is a perspective view illustrating a communication device according to various embodiments.
Figure 4B:
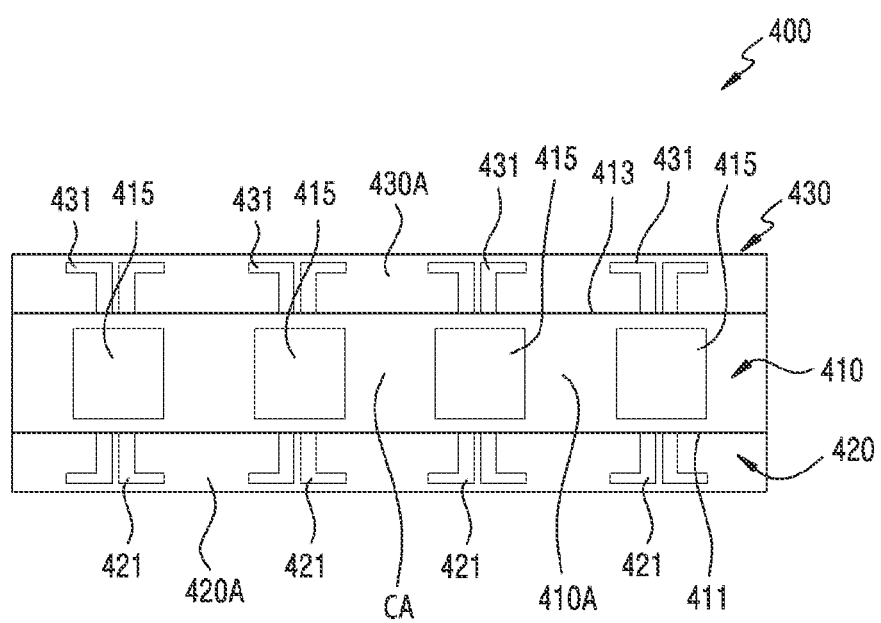
FIG. 4B is a plan view illustrating a communication device according to various embodiments.

FIG. 4A is a perspective view of a communication device 400 (e.g., the first communication device 321, the second communication device 322, the third communication device 323 or the fourth communication device 324 in FIG. 3A, or the communication device 360 in FIG. 3B) according to various embodiments. FIG. 4B is a plan view illustrating the communication device 400 according to various embodiments.

Referring to FIGS. 4A and 4B, the communication device 400 according to various embodiments includes at least one of a first printed circuit board 410 (e.g., the PCB 361 in FIG. 3B), a second printed circuit board 420, a third printed circuit board 430, or a wireless communication circuit 440 (e.g., the communication circuit 362 in FIG. 3B).

According to various embodiments, the first printed circuit board 410 may include a first surface (or the front surface) 410A and a second surface (or the rear surface) 410B. The first surface 410A and the second surface 410B may face away from each other. According to various embodiments, the first printed circuit board 410 may include a first edge 411 and a second edge 413. The first edge 411 and the second edge 413 may face away from each other.

According to various embodiments, the first printed circuit board 410 may include conductive plates 415 (e.g., the first antenna array 363 in FIG. 3B). According to an embodiment, the conductive plates 415 may be disposed on the first surface 410A. According to another embodiment, the conductive plates 415 may be disposed inside the first printed circuit board 410. The conductive plates 415 may be disposed in an array structure on the first printed circuit board 410. For example, the conductive plates 415 may be arranged in at least one row and at least one column. For example, the conductive plates 415 may include a patch antenna. According to some embodiments (not illustrated), the first printed circuit board 410 may not include the conductive plates 415.

According to various embodiments, the second printed circuit board 420 may extend from the first edge 411 of the first printed circuit board 410. For example, the second printed circuit board 420 may extend while being curved from the first edge 411 of the first printed circuit board 410. According to various embodiments, the second printed circuit board 420 may form an obtuse angle with the first surface 410A of the first printed circuit board 410. According to an embodiment, the second printed circuit board 420 may be bent while forming an obtuse angle with the first surface 410A. For example, the second printed circuit board 420 may include a first outer surface 420A and a first inner surface 420B facing away from the first outer surface 420A.

According to various embodiments, the second printed circuit board 420 may include first conductive patterns 421

(e.g., the second antenna array 364 in FIG. 3B). According to an embodiment, the first conductive patterns 421 may be disposed on the first outer surface 420A of the second printed circuit board 420. According to another embodiment, the first conductive patterns 421 may be disposed inside the second printed circuit board 420. The first conductive patterns 421 may be disposed in an array structure on the second printed circuit board 420. For example, the first conductive patterns 421 may be arranged in at least one row and at least one column. For example, the first conductive patterns 421 may include a dipole antenna.

According to various embodiments, the third printed circuit board 430 may extend from the second edge 413 of the first printed circuit board 410. For example, the third printed circuit board 430 may extend while being curved from the second edge 413 of the first printed circuit board 410. According to various embodiments, the third printed circuit board 430 may form an obtuse angle with the first surface 410A of the first printed circuit board 410. According to an embodiment, the third printed circuit board 430 may be bent while forming an obtuse angle with the first surface 410A. For example, the third printed circuit board 430 may include a second outer surface 430A and a second inner surface 430B facing away from the second outer surface 430A.

According to various embodiments, the third printed circuit board 430 may include one or more conductive patterns 431 (e.g., the second antenna array 364 in FIG. 3B). According to an embodiment, the second conductive patterns 431 may be disposed on the second outer surface 430A of the third printed circuit board 430. According to another embodiment, the second conductive patterns 431 may be disposed inside the third printed circuit board 430. The second conductive patterns 431 may be disposed in an array structure on the third printed circuit board 430. For example, the second conductive patterns 431 may be arranged in at least one row and at least one column. For example, the second conductive patterns 431 may include a dipole antenna.

According to various embodiments, the wireless communication circuit 440 may be disposed on at least a portion of the second surface 410B of the first printed circuit board 410. The wireless communication circuit 440 may be electrically connected to at least one of the conductive plates 415, the first conductive patterns 421, or the second conductive patterns 431. According to various embodiments, the wireless communication circuit 440 may transmit and/or receive a signal via at least one of the conductive plates 415, the first conductive patterns 421, or the second conductive patterns 431. For example, the signal may have a frequency between 3 GHz and 300 GHz.

Figure 4C:
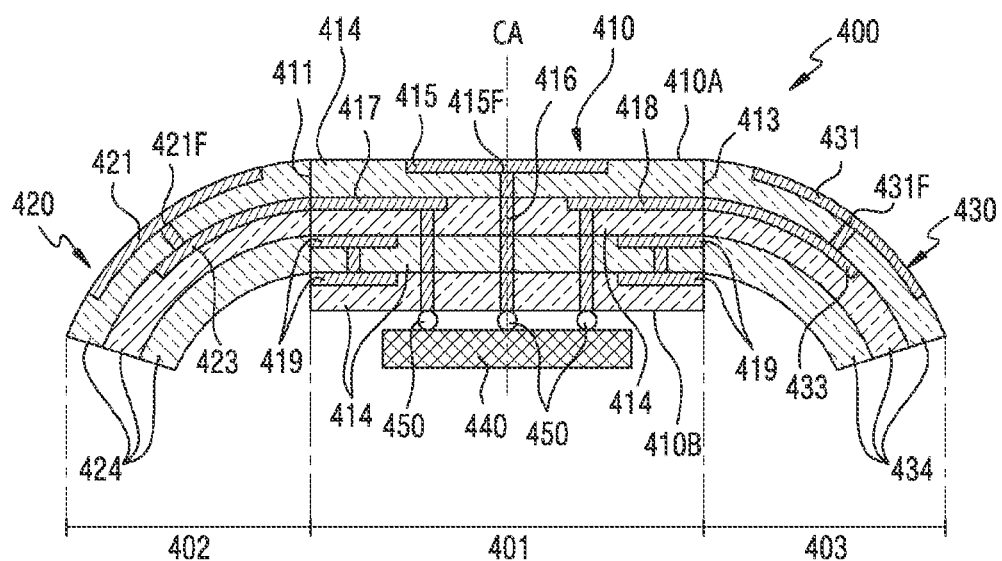
FIG. 4C is a cross-sectional view of a communication device according to an embodiment.

FIG. 4C is a cross-sectional view of a communication device 400 according to an embodiment. FIG. 4C shows a laminated structure of the communication device 400 of FIGS. 4A and 4B.

Referring to FIG. 4C, in the communication device 400 according to an embodiment, the first printed circuit board 410 may include a plurality of first layers 414, the second printed circuit board 420 may include a plurality of second layers 424, and the third printed circuit board 430 may include a plurality of third layers 434. According to an embodiment, the first layers 414 may be laminated along a central axis CA in a first area 401, the second layers 424 may be laminated in a second area 402 adjacent to the first area 401, and the third layers 434 may be laminated in a third area 403 adjacent to the first area 401. For example, at least some of the first layers 414 and at least some of the second layers 424 may be connected to each other, and at least some of the first layers 414 and at least some of the third layers 434 may be connected to each other. According to an embodiment, the conductive plates 415 may be disposed on the first surface 410A and/or in the first layers 414, the first conductive patterns 421 may be disposed the first outer surface 420A and/or in the second layers 424, and the second conductive patterns 431 may be disposed on the second outer surface 430A and/or in the third layers 434. For example, the boundary between the first area 401 and the second area 402 may form the first edge 411, and the boundary between the first area 401 and the third area 403 may form the second edge 413.

According to an embodiment, the first printed circuit board 410 may include at least one of a first transmission line 416, a second transmission line 417, a third transmission line 418, or a ground 419. The first transmission line 416 may be disposed in the first area 401 so as to electrically connect the wireless communication circuit 440 to the conductive plates 415. Through this, a first feeding point 415F may be disposed at a connection position between the conductive plates 415 and the first transmission line 416. The second transmission line 417 may be disposed in the first area 401 so as to electrically connect the wireless communication circuit 440 to the second printed circuit board 420. The third transmission line 418 may be disposed in the first area 401 so as to electrically connect the wireless communication circuit 440 to the third printed circuit board 430. For example, the first transmission line 416, the second transmission line 417, and the third transmission line 418 may penetrate at least one of the first layers 414 in the thickness direction of the first printed circuit board 410, or may extend along the surface of at least one of the first layers 414. The ground 419 may be disposed on at least one of the first layers 414. The ground 419 may be disposed so as not to be in contact with the first transmission line 416, the second transmission line 417, and the third transmission line 418. For example, the ground 419 may be disposed on the surface of at least one of the first layers 414. For example, the ground 419 may penetrate at least one of the first layers 414.

According to an embodiment, the first printed circuit board 410 may be electrically connected to the wireless communication circuit 440 via a plurality of connection parts 450. The connection parts 450 may electrically connect the first transmission line 416, the second transmission line 417, and the third transmission line 418 to the wireless communication circuit 440. The connection parts 450 may be disposed on the second surface 410B of the first printed circuit board 410. For example, the connection parts 450 may include a ball grid array (BGA).

According to an embodiment, the second printed circuit board 420 may include a first feed line 423. The first feed line 423 may be disposed in the second area 402 so as to electrically connect the second transmission line 417 of the first printed circuit board 410 to the first conductive pattern 421. A second feed point 421F may be disposed at a connection position between the first conductive pattern 421 and the first feed line 423. Through this, the first conductive pattern 421 may be electrically connected to the wireless communication circuit 440 via the first feed line 423 and the second transmission line 417. For example, the first feed line 423 may penetrate at least one of the second layers 424 in the thickness direction of the second printed circuit board 420, or may extend along the surface of at least one of the second layers 424.

According to an embodiment, the third printed circuit board 430 may include a second feed line 433. The second feed line 433 may be disposed in the third area 403 so as to electrically connect the third transmission line 418 of the first printed circuit board 430 to the second conductive pattern 431. A third feed point 431F may be disposed at a connection position between the second conductive pattern 431 and the second feed line 433. Through this, the second conductive pattern 431 may be electrically connected to the wireless communication circuit 440 via the second feed line 433 and the third transmission line 418. For example, the second feed line 433 may penetrate at least one of the third layers 434 in the thickness direction of the third printed circuit board 430, or may extend along the surface of at least one of the third layers 434.

Figure 4D:
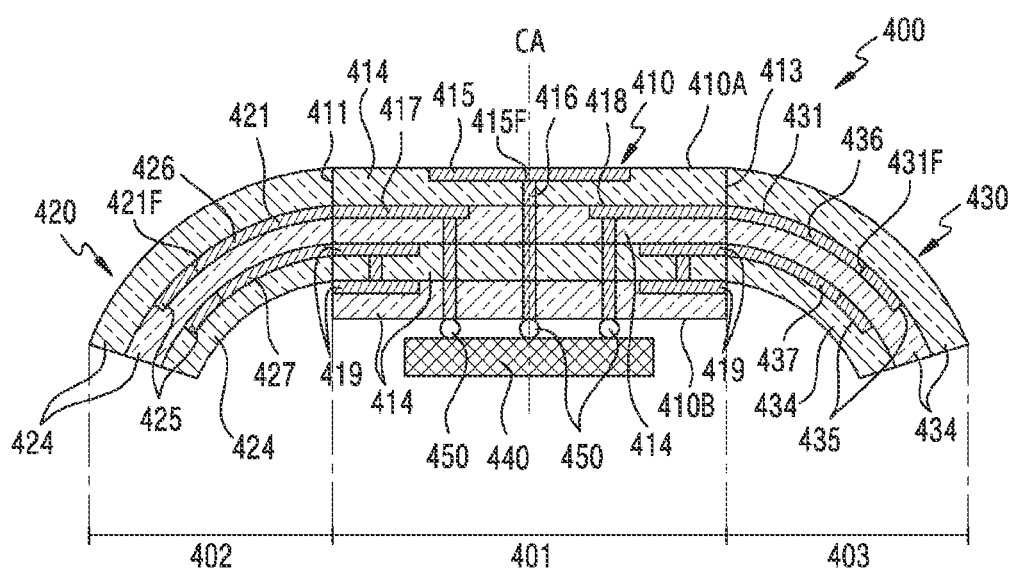
FIG. 4D is a cross-sectional view of a communication device according to another embodiment.

FIG. 4D is a cross-sectional view of a communication device 400 according to another embodiment. FIG. 4D illustrates a laminated structure of the communication device 400 of FIGS. 4A and 4B.

Referring to FIG. 4D, in the communication device 400 according to another embodiment, the first printed circuit board 410 may include a plurality of first layers 414, the second printed circuit board 420 may include a plurality of second layers 424, and the third printed circuit board 430 may include a plurality of third layers 434. According to another embodiment, the first layers 414 may be laminated along a central axis CA in a first area 401, the second layers 424 may be laminated in a second area 402 adjacent to the first area 401, and the third layers 434 may be laminated in a third area 403 adjacent to the first area 401. For example, at least some of the first layers 414 and at least some of the second layers 424 may be connected to each other, and at least some of the first layers 414 and at least some of the third layers 434 may be connected to each other. According to another embodiment, the conductive plates 415 may be disposed in the first area 401, the first conductive patterns 421 may be disposed in the second area 402, and the second conductive patterns 431 may be disposed in the third area 403. For example, the boundary between the first area 401 and the second area 402 may form the first edge 411, and the boundary between the first area 401 and the third area 403 may form the second edge 413.

According to another embodiment, the first printed circuit board 410 may include at least one of a first transmission line 416, a second transmission line 417, a third transmission line 418, or a ground 419. The first transmission line 416 may be disposed in the first area 401 so as to electrically connect the wireless communication circuit 440 to the conductive plates 415. Through this, a first feeding point 415F may be disposed at a connection position between the conductive plates 415 and the first transmission line 416. The second transmission line 417 may be disposed in the first area 401 so as to electrically connect the wireless communication circuit 440 to the second printed circuit board 420. The third transmission line 418 may be disposed in the first area 401 so as to electrically connect the wireless communication circuit 440 to the third printed circuit board 430. For example, the first transmission line 416, the second transmission line 417, and the third transmission line 418 may penetrate at least one of the first layers 414 in the thickness direction of the first printed circuit board 410, or may extend along the surface of at least one of the first layers 414. The ground 419 may be disposed on at least one of the first layers 414. The ground 419 may be disposed so as not to be in contact with the first transmission line 416, the second transmission line 417, and the third transmission line 418. For example, the ground 419 may be disposed on the surface of at least one of the first layers 414. For example, the ground 419 may penetrate at least one of the first layers 414.

According to another embodiment, the first printed circuit board 410 may be electrically connected to the wireless communication circuit 440 via a plurality of connection parts 450. The connection parts 450 may electrically connect the first transmission line 416, the second transmission line 417, and the third transmission line 418 to the wireless communication circuit 440. The connection parts 450 may be disposed on the second surface 410B of the first printed circuit board 410. For example, the connection parts 450 may include a ball grid array (BGA).

According to another embodiment, the second printed circuit board 420 may include a pair of first antenna elements 425, a first feed line 426, and/or a first ground line 427. When viewed from the first surface 410A of the communication device 400, the first antenna elements 425 may be disposed in the second area 402 to be spaced apart from each other by a predetermined distance. The first feed line 426 may be disposed in the second area 402 so as to electrically connect the second transmission line 417 of the first printed circuit board 410 to one of the first antenna elements 425. A second feed point 421F may be disposed at a connection position between one of the first antenna elements 425 and the first feed line 426. Through this, one of the first antenna elements 425 may be electrically connected to the wireless communication circuit 440 via the first feed line 426 and the second transmission line 417. The first ground line 427 may be disposed in the second area 402 so as to electrically connect a ground 419 of the first printed circuit board 410 to another one of the first antenna elements 425.

According to another embodiment, the third printed circuit board 430 may include a pair of second antenna elements 435, a second feed line 436, and/or a second ground line 437. When viewed from the first surface 410A of the communication device 400, the second antenna elements 435 may be disposed in the third area 403 to be spaced apart from each other by a predetermined distance. The second feed line 436 may be disposed in the third area 403 so as to electrically connect the third transmission line 418 of the first printed circuit board 410 to one of the second antenna elements 435. A third feed point 431F may be disposed at a connection position between one of the second antenna elements 435 and the second feed line 436. Through this, one of the second antenna elements 435 may be electrically connected to the wireless communication circuit 440 via the second feed line 436 and the third transmission line 418. The second ground line 437 may be disposed in the third area 403 so as to electrically connect a ground 419 of the first printed circuit board 410 to another one of the second antenna elements 435.

Figure 5A:
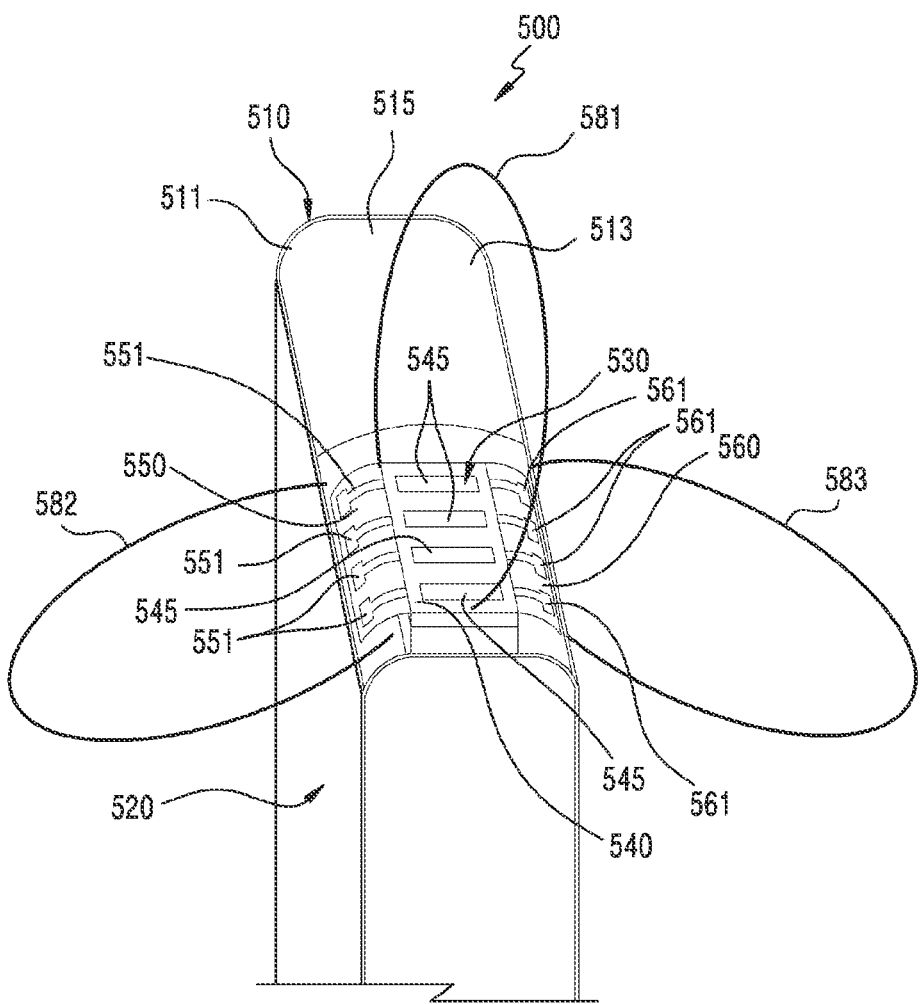
FIG. 5A is a perspective view illustrating an arrangement of a communication device in an electronic device according to various embodiments.
Figure 5B:
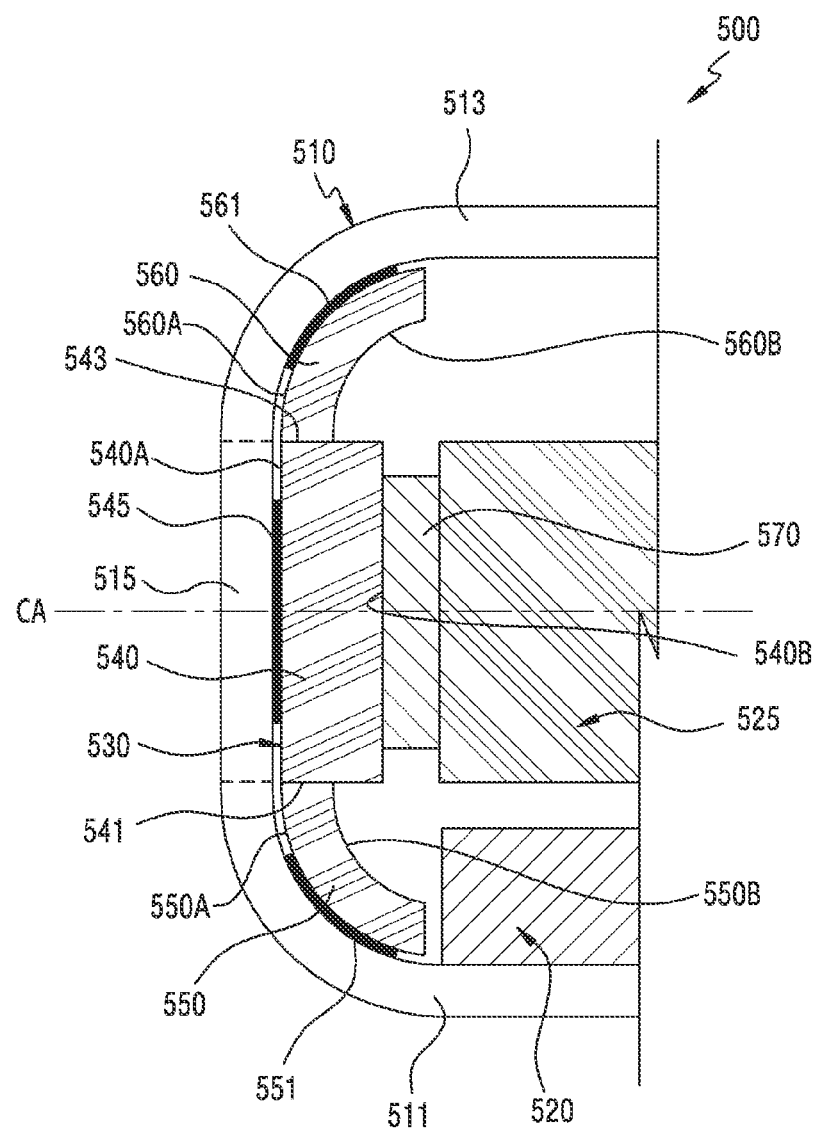
FIG. 5B is a cross-sectional view illustrating an arrangement of a communication device in an electronic device according to various embodiments.

FIG. 5A is a perspective view illustrating an arrangement of a communication device 530 (e.g., the communication device 400 in FIGS. 4A, 4B and 4C) in an electronic device 500 (e.g., the electronic device 200 in FIGS. 2A and 2B or the electronic device 220 in FIG. 2C) according to various embodiments. FIG. 5B is a cross-sectional view illustrating an arrangement of the communication device 530 in the electronic device 500 according to various embodiments.

Referring to FIGS. 5A and 5B, the electronic device 500 according to various embodiments may include at least one of a housing 510 (e.g., the housing 210 of FIG. 2A), a display 520 (e.g., the display 201 in FIG. 2A or the display 223 in FIG. 2C), a first support member 525 (e.g., the support member 221 in FIG. 2C), or at least one communication device 530.

According to various embodiments, the housing 510 may include a first plate 511 (e.g., the front plate 202 in FIG. 2A or the front plate 222 in FIG. 2C), a second plate 513 (e.g., the rear plate 211 in FIG. 2A or the rear plate 228 in FIG. 2C), and a side member 515 (e.g., the side bezel structure 218 in FIG. 2A or the side bezel structure 221 in FIG. 2C). The first plate 511 and the second plate 513 may face away from each other. The side member 515 may surround the space between the first plate 511 and the second plate 513.

According to an embodiment, at least a portion of the housing 510 may transmit signals transmitted and/or received from the communication device 530. To this end, at least a portion of the first plate 511, the second plate 513 and the side member 515 may be formed of, for example, coated or colored glass, ceramic, a polymer, and/or a combination of at least two of the above-mentioned materials. According to another embodiment (not illustrated), the first plate 511 and/or the second plate 513 may transmit signals transmitted and/or received from the communication device 530. To this end, the first plate 511 and/or the second plate 513 may be formed of, for example, coated or colored glass, ceramic, a polymer, or a combination of at least two of the above-mentioned materials, and at least a portion of the side member 515 may be formed of, for example, a metal (e.g., aluminum, stainless steel (STS), or magnesium).

According to various embodiments, the display 520 may be visible through a portion of the first plate 511 in the housing 510. For example, the display 520 may be disposed inside the electronic device 500, and may be coupled to the first plate 511 of the housing 510. As another example, the display 520 may be coupled between the first plate 511 and the first support member 525. According to various embodiments, the first support member 525 may be disposed inside the electronic device 500, and may be disposed between the first plate 511 and the second plate 513 of the housing 510. The first support member 525 may be connected to the side member 515, or may be integrally formed with the side member 515.

According to various embodiments, the communication device 530 may be disposed inside the electronic device 500, and may be disposed adjacent to at least a portion of the housing 510. For example, the communication device 530 may be coupled to the first support member 525. According to various embodiments, the communication device 530 may include at least one of a first printed circuit board 540 (e.g., the first printed circuit board 410 in FIGS. 4A, 4B, and 4C), a second printed circuit board 550 (e.g., the second printed circuit board 420 in FIGS. 4A, 4B, and 4C), a third printed circuit board 560 (e.g., the third printed circuit board 430 in FIGS. 4A, 4B, and 4C), or a wireless communication circuit 570 (e.g., the wireless communication circuit 440 in FIGS. 4A, 4B, and 4C). According to various embodiments, the first printed circuit board 540, the second printed circuit board 550, and the third printed circuit board 560 may form a U-shaped cross section.

According to various embodiments, the first printed circuit board 540 may be disposed adjacent to the side member 515 in at least a portion of the housing 510. According to an embodiment, the first printed circuit board 540 may be located between the display 520 and the side member 515 when viewed from above the first plate 511. According to various embodiments, the first printed circuit board 540 may include a first surface 540A (e.g., the first surface 410A in FIG. 4A) and a second surface 540B (e.g., the second surface 410B in FIG. 4A). The first surface 540A may face the side member 515 in at least a portion of the housing 510. The second surface 540B may face away from the first surface 540A. According to various embodiments, the first printed circuit board 540 may include a first edge 541 and a second edge 543. The first edge 541 and the second edge 543 may face away from each other. For example, the first edge 541 may be adjacent to the first plate 511, and the second edge 543 may be closer to the second plate 513 than the first edge 541.

According to various embodiments, the first printed circuit board 540 may include conductive plates 545 (e.g., the conductive plates 415 in FIGS. 4A, 4B, and 4C). According to an embodiment, the conductive plates 545 may be disposed on the first surface 540A. According to another embodiment, the conductive plates 545 may be disposed inside the first printed circuit board 540. For example, the conductive plates 545 may include a patch antenna. According to some embodiments (not illustrated), the first printed circuit board 540 may not include the conductive plates 545. For example, when the side member 515 of the housing 510 is formed of, for example, a metal, the first printed circuit board 540 may not include the conductive plates 545.

According to various embodiments, the second printed circuit board 550 may extend from the first edge 541 of the first printed circuit board 540. For example, the second printed circuit board 550 may extend while being curved from the first edge 541 of the first printed circuit board 540. According to various embodiments, the second printed circuit board 550 may form an obtuse angle with the first surface 540A of the first printed circuit board 540. According to an embodiment, the second printed circuit board 550 may be bent toward the display 520. For example, the second printed circuit board 550 may include a first outer surface 550A and a first inner surface 550B facing away from the first outer surface 550A.

According to various embodiments, the second printed circuit board 550 may include first conductive patterns 551 (e.g., the first conductive patterns 421 in FIGS. 4A, 4B, and 4C). For example, the first conductive patterns 551 may extend parallel to each other from the first edge 541 toward the first plate 511. According to an embodiment, the first conductive patterns 551 may be disposed on the first outer surface 550A of the second printed circuit board 550. According to another embodiment, the first conductive patterns 551 may be disposed inside the second printed circuit board 550. For example, the first conductive patterns 551 may include a dipole antenna.

According to various embodiments, the third printed circuit board 560 may extend from the second edge 556 of the first printed circuit board 540. For example, the third printed circuit board 560 may extend while being curved from the second edge 556 of the first printed circuit board 540. According to various embodiments, the third printed circuit board 560 may form an obtuse angle with the first surface 540A of the first printed circuit board 540. According to an embodiment, the third printed circuit board 560 may be bent so as to be symmetrical to the second printed circuit board 550 with respect to the central axis CA of the first printed circuit board 540. For example, the third printed circuit board 560 may include a second outer surface 560A and a second inner surface 560B facing away from the second outer surface 560A.

According to various embodiments, the third printed circuit board 560 may include one or more second conductive patterns 561 (e.g., the second conductive patterns 431 in FIGS. 4A, 4B, and 4C). For example, the second conductive patterns 561 may extend parallel to each other from the second edge 543 toward the second plate 513. According to an embodiment, the second conductive patterns 561 may be disposed on the second outer surface 560A of the third printed circuit board 560. According to another embodiment, the second conductive patterns 561 may be disposed inside the third printed circuit board 560. For example, the second conductive patterns 561 may include a dipole antenna.

According to various embodiments, the wireless communication circuit 570 may be disposed on at least a portion of the second surface 540B of the first printed circuit board 540. The wireless communication circuit 570 may be electrically connected to at least one of the conductive plates 545, the first conductive patterns 551, or the second conductive patterns 561. According to various embodiments, the wireless communication circuit 570 may transmit and/or receive a signal via at least one of the conductive plates 545, the first conductive patterns 551, or the second conductive patterns 561. For example, the signal may have a frequency between 3 GHz and 300 GHz.

According to an embodiment, the wireless communication circuit 570 may transmit and/or receive signals through a first beam 581 generated in a first direction by the conductive plates 545, a second beam 582 generated in a second direction by the first conductive patterns 551, and a third beam 583 generated in a third direction by the second conductive patterns 561. According to another embodiment (not illustrated), the wireless communication circuit 570 may transmit and/or receive signals through a second beam 582 generated in a second direction by the first conductive patterns 551 and a third beam 583 generated in a third direction by the second conductive patterns 561. For example, when the first printed circuit board 540 does not include the conductive plates 545, the wireless communication circuit 570 may transmit and/or receive signals through the second beam 582 and the third beam 583.

An electronic device 500 according to various embodiments may include: a housing 510 including a first plate 511, a second plate 513 facing away from the first plate 511, and a side member 515 surrounding the space between the first plate 511 and the second plate 513; a display 520 visible through a portion of the first plate 511; a first printed circuit board 540 including a first surface 540A facing the side member 515, a second surface 540B facing away from the first surface 540A, a first edge 541 located close to the first plate 511, and a second edge 543 located closer to the second plate 513 than the first edge 541, the first printed circuit board 540 including one or more conductive plates 545 on the first surface 540A; a second printed circuit board 550 extending from the first edge 541 and bent while forming an obtuse angle with the first surface 540A, the second printed circuit board including one or more first conductive patterns 551; a third printed circuit board 560 extending from the second edge 543 and bent while forming an obtuse angle with the first surface 540A, the third printed circuit board 560 including one or more second conductive patterns 561; and a wireless communication circuit 570 electrically connected to the conductive plates 545, the first conductive patterns 551, and the second conductive patterns 561, and configured to transmit and/or receive a signal having a frequency between 3 GHz and 300 GHz.

According to various embodiments, the conductive plates 545 may configure a patch antenna.

According to various embodiments, at least one of the first conductive patterns 551 or the second conductive patterns 561 may configure a dipole antenna.

According to various embodiments, the wireless communication circuit 570 may be disposed on the second surface 540B.

According to various embodiments, the first conductive patterns 551 may extend parallel to each other from the first edge 541 toward the first plate 511, and the second conductive patterns 561 may extend parallel to each other from the second edge 543 toward the second plate 513.

According to various embodiments, the first printed circuit board 540 may be positioned between the display 520 and the side member 515 when viewed from above the first plate 511, and the second printed circuit board 550 may be bent toward the display 520.

According to various embodiments, the second printed circuit board 550, the first printed circuit board 540, and the third printed circuit board 560 form a U-shaped cross section.

An electronic device 500 according to various embodiments may include: a housing 510 including a first plate 511, a second plate 513 facing away from the first plate 511, and a side member 515 surrounding the space between the first plate 511 and the second plate 513; a display 520 visible through a portion of the first plate 511; a first printed circuit board 540 including a first surface 540A facing the side member 515, a second surface 540B facing away from the first surface 540A, a first edge 541 located close to the first plate 511, and a second edge 543 located closer to the second plate 513 than the first edge 541; a second printed circuit board 550 extending from the first edge 541 and bent while forming an obtuse angle with the first surface 540A, the second printed circuit board including one or more first conductive patterns 551; a third printed circuit board 560 extending from the second edge 543 and bent while forming an obtuse angle with the first surface 540A, the third printed circuit board 560 including one or more second conductive patterns 561; and a wireless communication circuit 570 electrically connected to the first conductive patterns 551 and the second conductive patterns 561 and configured to transmit and/or receive a signal having a frequency between 3 GHz and 300 GHz.

According to various embodiments, the wireless communication circuit 570 may be disposed on the second surface 540B.

According to various embodiments, the first printed circuit board 540 may be positioned between the display 520 and the side member 515 when viewed from above the first plate 511, and the second printed circuit board 550 may be bent toward the display 520.

According to various embodiments, the second printed circuit board 550, the first printed circuit board 540, and the third printed circuit board 560 form a U-shaped cross section.

Figure 6A:
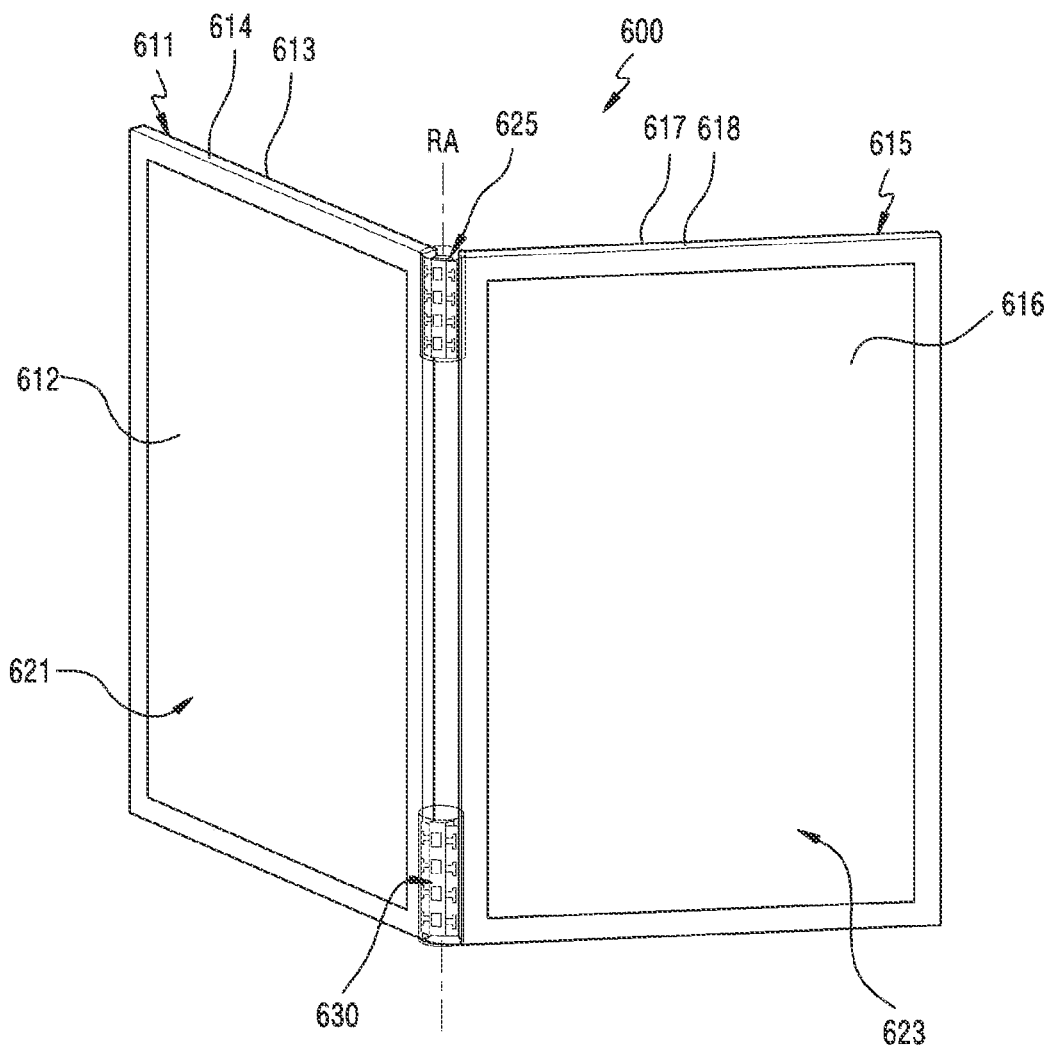
FIG. 6A is a perspective view illustrating an arrangement of a communication device in an electronic device according to various embodiments.
Figure 6B:
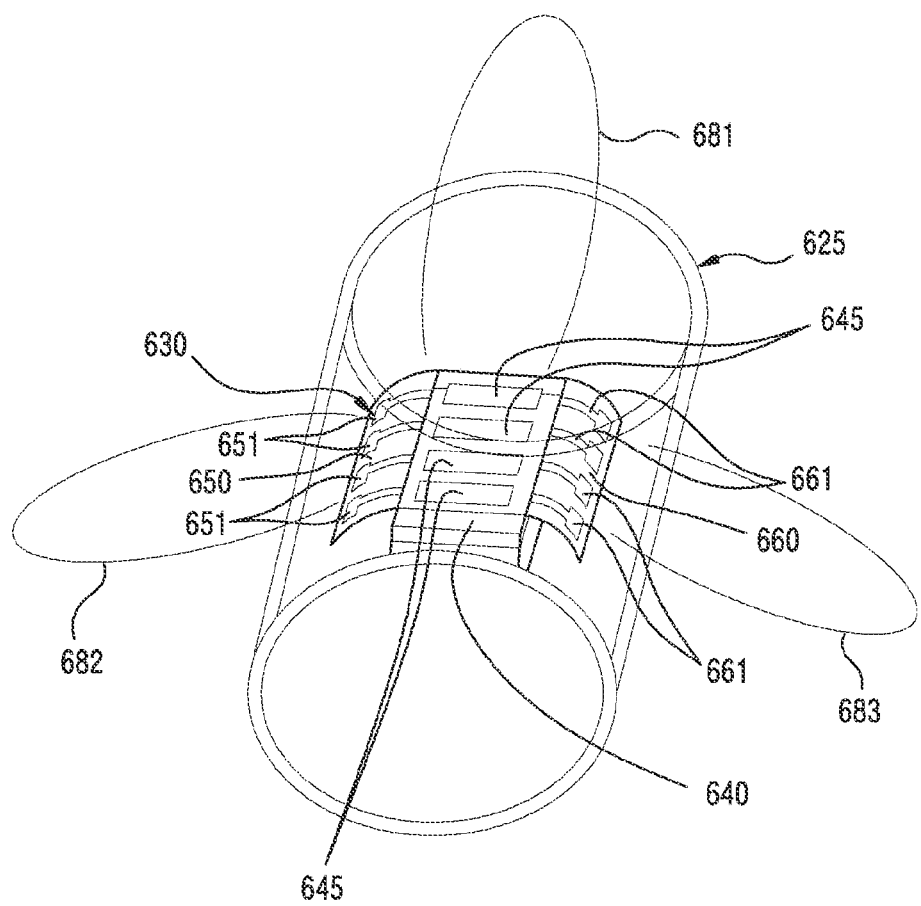
FIG. 6B is a perspective view illustrating a hinge in an electronic device according to various embodiments.
Figure 6C:
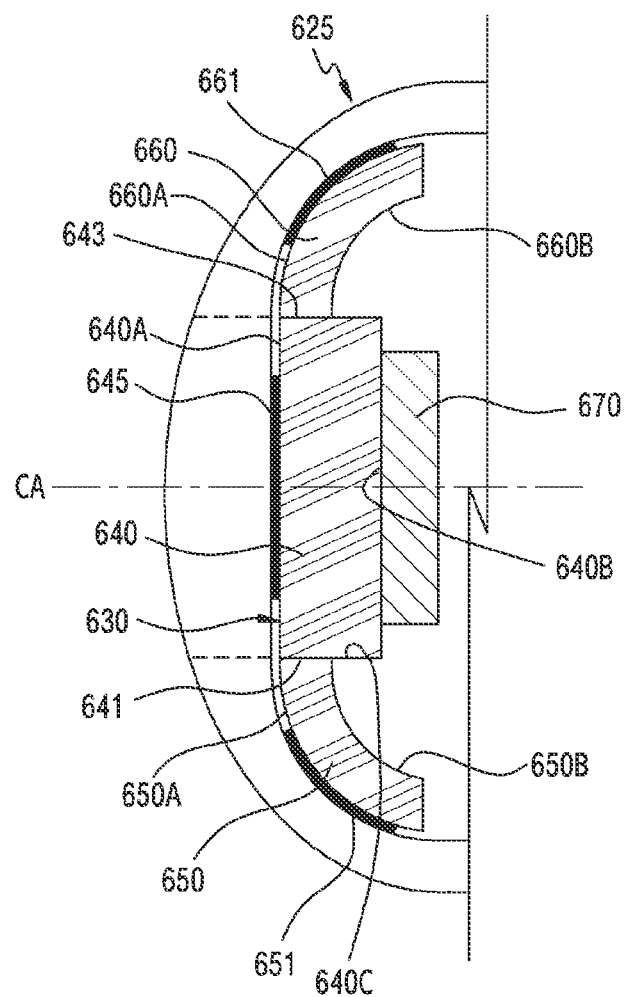
FIG. 6C is a cross-sectional view illustrating a hinge in an electronic device according to various embodiments.

FIG. 6A is a perspective view illustrating an arrangement of a communication device 630 (e.g., the communication device 400 in FIGS. 4A, 4B and 4C) in an electronic device 600 (e.g., the electronic device 200 in FIGS. 2A and 2B or the electronic device 220 in FIG. 2C) according to various embodiments. FIG. 6B is a perspective view illustrating a hinge 625 in the electronic device 600 according to various embodiments. FIG. 6C is a cross-sectional view illustrating the hinge 625 in the electronic device 600 according to various embodiments.

Referring to FIGS. 6A, 6B, and 6C, the electronic device 600 according to various embodiments may include at least one of a first housing 611, a second housing 615, a first display 621, a second display 623, at least one hinge 625, or at least one communication device 630.

According to various embodiments, the first housing 611 may include a first plate 612, a second plate 613, and a first side member 614. The first plate 612 and the second plate 613 may face away from each other. The first side member 614 may surround the space between the first plate 612 and the second plate 613.

According to various embodiments, the second housing 615 may include a third plate 616, a fourth plate 617, and a second side member 618. The third plate 616 and the fourth plate 617 may face away from each other. The second side member 618 may surround the space between the third plate 616 and the fourth plate 617.

According to various embodiments, the first display 621 may be visible through a portion of the first plate 612 in the first housing 611. For example, the first display 621 may be disposed inside the first housing 611, and may be coupled to the first plate 612.

According to various embodiments, the second display 623 may be visible through a portion of the third plate 616 in the second housing 615. For example, the second display 623 may be disposed inside the second housing 615, and may be coupled to the third plate 616.

According to various embodiments, the hinge 625 may connect the first housing 611 and the second housing 615 to each other between the first housing 611 and the second housing 615. For example, the hinge 625 may be coupled to the first side member 614 of the first housing 611 and the second side member 618 of the second housing 615. According to various embodiments, the hinge 625 may connect the first housing 611 and the second housing 615 to be rotatable about an axis (rotation axis) RA between the first housing 611 and the second housing 615.

According to various embodiments, the first housing 611 and the second housing 615 are rotatable with the aid of the hinge 625. By the rotation of the first housing 611 and the second housing 615, the first plate 612 and the third plate 616 may be arranged on the same plane, may be arranged to be inclined to each other, or may be arranged parallel to face each other. According to an embodiment, when the first plate 612 and the third plate 616 are arranged on the same plane, the first display 621 and the second display 623 may be arranged substantially parallel to each other while being oriented in the same direction. According to an embodiment, when the first plate 612 and the third plate 616 are disposed parallel to each other, the first display 621 and the second display 623 may face each other.

According to various embodiments, the communication device 630 may be disposed on the hinge 625 so as to be disposed between the first housing 611 and the second housing 615. According to various embodiments, the communication device 630 may include at least one of a first printed circuit board 640 (e.g., the first printed circuit board 410 in FIGS. 4A, 4B, and 4C), a second printed circuit board 650 (e.g., the second printed circuit board 420 in FIGS. 4A, 4B, and 4C), a third printed circuit board 660 (e.g., the third printed circuit board 430 in FIGS. 4A, 4B, and 4C), or a wireless communication circuit 670 (e.g., the wireless communication circuit 440 in FIGS. 4A, 4B, and 4C). According to various embodiments, the first printed circuit board 640, the second printed circuit board 650, and the third printed circuit board 660 may form a U-shaped cross section.

According to various embodiments, the first printed circuit board 640 may be disposed between the first housing 611 and the second housing 615 inside the hinge 625. According to an embodiment, in the first printed circuit board 640, the first housing 611 and the second housing 615 are rotatable with the aid of the hinge 625 such that, when the first plate 612 and the third plate 616 are disposed on the same plane, the first printed circuit board 640 may be located parallel to the plane on which first plate 616 and the third plate 616 are disposed. According to various embodiments, the first printed circuit board 640 may include a first surface 640A (e.g., the first surface 410A in FIG. 4A) and a second surface 640B (e.g., the second surface 410B in FIG. 4A). The first surface 640A may face at least a portion of the hinge 625 inside the hinge 625. The second surface 640B may face away from the first surface 640A. According to various embodiments, the first printed circuit board 640 may include a first edge 641 and a second edge 643. The first edge 641 and the second edge 643 may face away from each other. The first edge 641 may be adjacent to the first housing 611, and the second edge 643 may be closer to the second housing 615 than the first edge 641.

According to various embodiments, the first printed circuit board 640 may include conductive plates 645 (e.g., the conductive plates 415 in FIGS. 4A, 4B, and 4C). According to an embodiment, the conductive plates 645 may be disposed on the first surface 640A. According to another embodiment, the conductive plates 645 may be disposed inside the first printed circuit board 640. For example, the conductive plates 645 may include a patch antenna. According to some embodiments (not illustrated), the first printed circuit board 640 may not include the conductive plates 645.

According to various embodiments, the second printed circuit board 650 may extend from the first edge 641 of the first printed circuit board 640. For example, the second printed circuit board 650 may extend while being curved from the first edge 641 of the first printed circuit board 640. According to various embodiments, the second printed circuit board 650 may form an obtuse angle with the first surface 640A of the first printed circuit board 640. For example, the second printed circuit board 650 may include a first outer surface 650A and a first inner surface 650B facing away from the first outer surface 650A.

According to various embodiments, the second printed circuit board 650 may include first conductive patterns 651 (e.g., the first conductive patterns 421 in FIGS. 4A, 4B, and 4C). For example, the first conductive patterns 651 may extend parallel to each other from the first edge 641 toward the first housing 611. According to an embodiment, the first conductive patterns 651 may be disposed on the first outer surface 650A of the second printed circuit board 650. According to another embodiment, the first conductive patterns 651 may be disposed inside the second printed circuit board 650. For example, the first conductive patterns 651 may include a dipole antenna.

According to various embodiments, the third printed circuit board 660 may extend from the second edge 656 of the first printed circuit board 640. For example, the third printed circuit board 660 may extend while being curved from the second edge 656 of the first printed circuit board 640. According to various embodiments, the third printed circuit board 660 may form an obtuse angle with the first surface 640A of the first printed circuit board 640. According to an embodiment, the third printed circuit board 660 may be bent so as to be symmetrical to the second printed circuit board 650 with respect to the central axis CA of the first printed circuit board 640. For example, the third printed circuit board 660 may include a second outer surface 660A and a second inner surface 660B facing away from the second outer surface 660A.

According to various embodiments, the third printed circuit board 660 may include second conductive patterns 661 (e.g., the second conductive patterns 431 in FIGS. 4A, 4B, and 4C). For example, the second conductive patterns 661 may extend parallel to each other from the second edge 643 toward the second housing 615. According to an embodiment, the second conductive patterns 661 may be disposed on the second outer surface 660A of the third printed circuit board 660. According to another embodiment, the second conductive patterns 661 may be disposed inside the third printed circuit board 660. For example, the second conductive patterns 661 may include a dipole antenna.

According to various embodiments, the wireless communication circuit 670 may be disposed on at least a portion of the second surface 640B of the first printed circuit board 640. The wireless communication circuit 670 may be electrically connected to at least one of the conductive plates 645, the first conductive patterns 651, or the second conductive patterns 661. According to various embodiments, the wireless communication circuit 670 may transmit and/or receive a signal via at least one of the conductive plates 645, the first conductive patterns 651, or the second conductive patterns 661. For example, the signal may have a frequency between 3 GHz and 300 GHz.

According to an embodiment, the wireless communication circuit 670 may transmit and/or receive signals through a first beam 681 generated in a first direction by the conductive plates 645, a second beam 682 generated in a second direction by the first conductive patterns 651, and a third beam 683 generated in a third direction by the second conductive patterns 661. According to another embodiment (not illustrated), the wireless communication circuit 670 may transmit and/or receive signals through a second beam 682 generated in a second direction by the first conductive patterns 651 and a third beam 683 generated in a third direction by the second conductive patterns 661. For example, when the first printed circuit board 640 does not include the conductive plates 645, the wireless communication circuit 670 may transmit and/or receive signals through the second beam 682 and the third beam 683.

An electronic device 600 according to various embodiments may include: a first housing 611; a second housing 615; a hinge 625 connecting the first housing 611 and the second housing 615 to be rotatable about an axis RA between the first housing 611 and the second housing 615; a first printed circuit board 640 including, inside the hinge 625, a first surface 640A between the first housing 611 and the second housing 615, a second surface 640B facing away from the first surface 640A, a first edge 641 located close to the first housing 611, and a second edge 643 located closer to the second housing 615 than the first edge 641, the first printed circuit board 640 including one or more conductive plates 645 on the first surface 640A; a second printed circuit board 650 extending from the first edge 641 and bent while forming an obtuse angle with the first surface 640A, the second printed circuit board including one or more first conductive patterns 651; a third printed circuit board 660 extending from the second edge 643 and bent while forming an obtuse angle with the first surface 640A, the third printed circuit board 660 including one or more second conductive patterns 661; and a wireless communication circuit 670 electrically connected to the conductive plates 645, the first conductive patterns 651, and the second conductive patterns 661, and configured to transmit and/or receive a signal having a frequency between 3 GHz and 300 GHz.

According to various embodiments, the first housing 611 may include a first plate 612 and a second plate 613 facing away from the first plate 612, and the second housing 615 may include a third plate 616 and a fourth plate 617 facing away from the third plate 616.

According to various embodiments, the electronic device may further include at least one of a first plate 621 visible through a portion of the first plate 612 and a second display 623 visible through a portion of the third plate 616.

According to various embodiments, the first housing 611 and the second housing 615 are rotatable with the aid of the hinge 625 such that, when the first plate 612 and the third plate 616 are disposed on the same plane, the first printed circuit board 640 may be located parallel to the plane.

According to various embodiments, the conductive plates 645 may configure a patch antenna.

According to various embodiments, at least one of the first conductive patterns 651 or the second conductive patterns 661 may configure a dipole antenna.

According to various embodiments, the wireless communication circuit 670 may be disposed on the second surface 640B.

According to various embodiments, the first conductive patterns 651 may extend parallel to each other from the first edge 641 toward the first housing 611, and the second conductive patterns 661 may extend parallel to each other from the second edge 643 toward the second housing 615.

According to various embodiments, the second printed circuit board 650, the first printed circuit board 640, and the third printed circuit board 660 form a U-shaped cross section.

The invention claimed is:

1. An electronic device comprising:
a housing comprising a first plate, a second plate facing away from the first plate, and a side member surrounding a space between the first plate and the second plate;
a display visible through a portion of the first plate;
a first printed circuit board comprising a first surface facing the side member, a second surface facing away from the first surface, a first edge located close to the first plate, and a second edge located closer to the second plate than the first edge, the first printed circuit board comprising one or more conductive plates disposed on the first surface;
a second printed circuit board extending from the first edge and bent while forming an obtuse angle with the first surface, the second printed circuit board comprising one or more first conductive patterns facing the side member;
a third printed circuit board extending from the second edge and bent while forming an obtuse angle with the first surface, the third printed circuit board comprising one or more second conductive patterns facing the side member; and
a wireless communication circuit configured to transmit and/or receive signals having a frequency between 3 gigahertz (GHz) and 300 GHz using the one or more conductive plates, the one or more first conductive patterns forming a first signal beam toward the side member, and the one or more second conductive patterns forming a second signal beam toward the side member.

2. The electronic device of claim 1, wherein the one or more conductive plates configure a patch antenna.

3. The electronic device of claim 1, wherein at least one of the one or more first conductive patterns or the one or more second conductive patterns configures a dipole antenna.

4. The electronic device of claim 1, wherein the wireless communication circuit is disposed on the second surface.

5. The electronic device of claim 1, wherein the one or more first conductive patterns extend parallel to each other from the first edge toward the first plate, and wherein the one or more second conductive patterns extend parallel to each other from the second edge toward the second plate.

6. The electronic device of claim 1, wherein the first printed circuit board is positioned between the display and the side member when viewed from above the first plate, and the second printed circuit board is bent toward the display.

7. The electronic device of claim 6, wherein the second printed circuit board, the first printed circuit board, and the third printed circuit board form a U-shaped cross section.

8. An electronic device comprising:

a housing including a first plate, a second plate facing away from the first plate, and a side member surrounding a space between the first plate and the second plate;

a display visible through a portion of the first plate;

a first printed circuit board comprising a first surface facing the side member, a second surface facing away from the first surface, a first edge located close to the first plate, and a second edge located closer to the second plate than the first edge;

second printed circuit board extending from the first edge and bent while forming an obtuse angle with the first surface, the second printed circuit board comprising one or more first conductive patterns facing the side member;

a third printed circuit board extending from the second edge and bent while forming an obtuse angle with the first surface, the third printed circuit board comprising one or more second conductive patterns facing the side member; and a wireless communication circuit configured to transmit and/or receive signals having a frequency between 3 gigahertz (GHz) and 300 GHz using the one or more first conductive patterns forming a first signal beam toward the side member, and the one or more second conductive patterns forming a second signal beam toward the side member.

9. The electronic device of claim 8, wherein the first printed circuit board comprises one or more conductive plates disposed on the first surface.

10. The electronic device of claim 8, wherein at least one of the one or more first conductive patterns or the one or more second conductive patterns configures a dipole antenna.

11. The electronic device of claim 8, wherein the wireless communication circuit is disposed on the second surface.

12. The electronic device of claim 8, wherein the one or more first conductive patterns extend parallel to each other from the first edge toward the first plate, and wherein the one or more second conductive patterns extend parallel to each other from the second edge toward the second plate.

13. The electronic device of claim 8, wherein the second printed circuit board, the first printed circuit board, and the third printed circuit board form a U-shaped cross section.

* * * * *